US 6,662,331 B1

(12) United States Patent
Kang (10) Patent No.: US 6,662,331 B1
(45) Date of Patent: Dec. 9, 2003

(54) SPACE-EFFICIENT TURBO DECODER

(75) Inventor: Inyup Kang, San Diego, CA (US)

(73) Assignee: Qualcomm Inc., San Diego, CA (US)

(*) Notice: Subject to any disclaimer, the term of this patent is extended or adjusted under 35 U.S.C. 154(b) by 452 days.

(21) Appl. No.: 09/699,252

(22) Filed: Oct. 27, 2000

(51) Int. Cl.⁷ ............................................. H03M 13/00
(52) U.S. Cl. ...................................................... 714/755
(58) Field of Search ................... 714/755, 797, 714/786

(56) References Cited

U.S. PATENT DOCUMENTS

| | | | |
|---|---|---|---|
| 6,263,467 B1 * | 7/2001 | Hladik et al. | 714/755 |
| 6,343,368 B1 * | 1/2002 | Lerzer | 714/796 |
| 6,392,572 B1 * | 5/2002 | Shiu et al. | 341/81 |
| 6,434,203 B1 * | 8/2002 | Halter | 375/341 |

FOREIGN PATENT DOCUMENTS

WO  0010254  2/2000  .......... H03M/13/00

OTHER PUBLICATIONS

Application Note 62 Dual Port RAM—Dallas Semiconductor—Jun. 3, 1998, pps. 1–6.
Cheryl Brennan, "Introduction to Multi–port Memories", IDT Application Note AN–253, Mar. 2000, pps. 1–2.

* cited by examiner

Primary Examiner—Phung M. Chung
(74) Attorney, Agent, or Firm—Philip Wadsworth; Charles Brown; Donald Kordich (57) ABSTRACT

An efficient turbo decoder. The disclosed turbo decoder includes a first mode of operation in which the turbo decoder uses a first functional loop. The first functional loop includes a memory bank, a read interleaver, a first multiplexer (MUX), a RAM file, a log-MAP decoder, a write interleaver, and a second MUX. The disclosed turbo decoder further includes a second mode of operation in which a second functional loop is used. The second functional loop includes the memory bank, the first MUX, the RAM file, the log-MAP decoder, and the second MUX. The memory bank is a dual port extrinsic memory. The disclosed turbo decoder circuit switches between the first mode and the second mode.

7 Claims, 4 Drawing Sheets

SPACE-EFFICIENT TURBO DECODER

BACKGROUND OF THE INVENTION

1. Field of Invention

This invention relates to wireless communications systems. Specifically, the present invention relates to memory-efficient turbo decoders employed in wireless Code Division Multiple Access (CDMA) communications systems.

2. Description of the Related Art

Cellular telecommunications systems are characterized by a plurality of mobile transceivers, such as mobile phones, in communication with one or more base stations. Each transceiver includes a transmitter and a receiver.

In a typical CDMA transceiver, an analog radio frequency (RF) signal is received by an antenna and downconverted by an RF section to an Intermediate Frequency (IF). Signal processing circuits perform noise filtering and adjust the magnitude of the signal via analog automatic gain control (AGC) circuitry. An IF section then mixes the signal down to baseband and converts the analog signal to a digital signal. The digital signal is then input to a baseband processor for further signal processing, such as turbo decoding, to output voice or data.

Similarly, the transmitter receives a digital input from the baseband processor and converts the input to an analog signal. The digital input signal is often a turbo-encoded signal. This signal is then filtered and upconverted by an IF stage to an intermediate frequency. The gain of the transmit signal is adjusted and the IF signal is converted to RF in preparation for radio transmission.

The link between a transmitter and a receiver is a channel. To increase system capacity, receivers in the mobile stations and base stations must effectively operate at lower Signal-to-Interference Ratios (SIRs), or the SIR of the channel must be increased. Special coding schemes are often employed to reduce the required SIR.

Coding for communications signals involves the addition of redundant information to the signals. By strategically adding redundancy to communications signals transmitted in noisy environments, errors introduced by a noisy channel are reduced to a desired level. As shown by Claude Shannon in 1948, if the information rate of the communications signals is less than the channel capacity, the desired noise level is attainable without a reduction of the information rate. If redundancy is not employed in a noisy environment, error-free performance is difficult or impossible to obtain.

To improve the performance of a wireless communications system in a noisy and Raleigh-faded environment, interleavers following signal encoders are often employed. An interleaver spreads the codewords output from an encoder so that individual bits of a given codeword are separated and transmitted at different times. Consequently, bits of a given code experience independent fading, where the bits affected by an error burst belong to several codewords. At the receiver, received signal samples are deinterleaved before decoding. Several types of interleavers exist, including diagonal, convolutional, interblock, and block interleavers.

Turbo codes are serial or parallel concatenations of two or more constituent codes that have been separated by one or more code interleavers. Turbo encoders and decoders are often employed to improve error control and to reduce the required SIR. Turbo codes are often decoded with an interative algorithm to achieve low error rates at signal-to-noise (SNR) ratios approaching the Shannon limit. As an essential part of the turbo code, code interleavers and deinterleavers must be inserted between the component code encoders and decoders, respectively. The performance of turbo codes depends on the length and structure of the code interleavers. Good turbo code performance can be achieved by using interleavers having pseudo random structures.

In wireless CDMA communications systems, turbo encoders often produce parallel concatenations of a constituent convolutional code and one or more interleaved versions of the code. The encoders typically include one or more convolutional encoders connected through one or more interleavers. The corresponding turbo decoder generally includes inner and outer Logarithmic Maximum A Posteriori (log-MAP) decoders connected in a loop having an interleaver and a deinterleaver. The loop implements an iterative algorithm to approximate a Log Likelihood Ratio (LLR). Conventionally, if an LLR>0, the decoded bit is most likely 1, and if the LLR<1, the decoded bit is most likely 0. Based on the LLRs, the decoder outputs either a 1 or a 0 representing a hard decision. The recursive process employed to determine the LLRs is called the Log-MAP Algorithm and includes two instances of the metric calculator, one performing a forward recursion and the other performing a backward recursion.

To enhance the efficiency and cost of turbo decoders, one or more of the constituent decoders is often replaced with a multiplexer and two extrinsic memories. The multiplexer controls signaling through the turbo decoder loop so that a single decoder may replace one or more decoders while maintaining the functional integrity of the turbo decoder.

Unfortunately, such turbo decoders often require at least two extrinsic memories, one to store information from one loop section while the decoder is used for the other loop section and visa versa. The extrinsic memory banks are often large and expensive, yielding large and expensive wireless communications devices.

Hence, a need exists in the art for a cost-effective and space-efficient turbo decoder for use in a CDMA system that does not require dual extrinsic memory banks. There exists a further need for a wireless communications system employing the space-efficient turbo decoder and a corresponding method for obviating the need for dual memories in accompanying turbo decoders. There exists a further need for an efficient dual port extrinsic memory adapted for use with the space-efficient turbo decoder of the present invention.

SUMMARY OF THE INVENTION

The need in the art is addressed by the system for eliminating a redundant memory bank in a digital circuit while maintaining the overall functional integrity of the digital circuit. In the illustrative embodiment, the disclosed turbo decoder circuit is adapted for use in a turbo decoder of a wireless communications system. The disclosed turbo decoder includes a first mode of operation in which the turbo decoder uses a first functional loop. The first functional loop includes a memory bank, a read interleaver, a first multiplexer (MUX), a RAM file, a log-MAP decoder, a write interleaver, and a second MUX. The disclosed turbo decoder further includes a second mode of operation in which a second functional loop is used. The second functional loop includes the memory bank, the first MUX, the RAM file, the log-MAP decoder, and the second MUX.

In one embodiment, the memory bank is a dual port extrinsic memory. The disclosed turbo decoder circuit switches between the first mode and the second mode.

The disclosed method and apparatus eliminates the need for an two extrinsic memories in a turbo decoder by selectively employing a single extrinsic memory for use in two separate decoder functional sections and for two different operational modes.

DETAILED DESCRIPTION OF EMBODIMENTS

While the presently disclosed method and apparatus is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
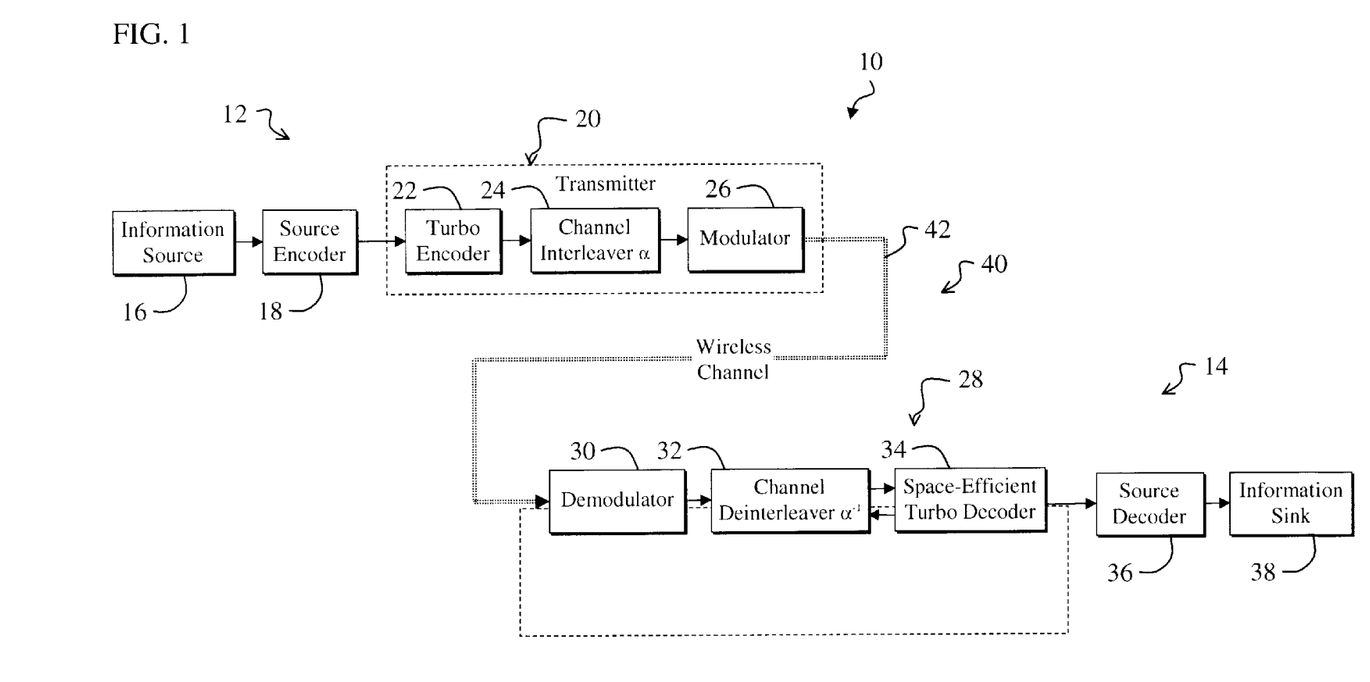
FIG. 1 is a block diagram of a wireless communications system constructed in accordance with the teachings disclosed herein.

FIG. 1 is a block diagram of a wireless communications system 10 constructed in accordance with the teachings disclosed herein. For clarity, various components, such as antennas, power supplies, clocking circuits, amplifiers, etc., are not shown in FIG. 1, however these are well know to those skilled in the art. As such, one skilled in the art will know how to implement such components.

The system 10 includes a transmitting device 12 and a receiving device 14. The transmitting device 12 includes an information source 16, a source encoder 18, and a transmitter 20. The transmitter 20 includes a turbo encoder 22, a channel interleaver 24, and a modulator 26. An output of the information source 16 is input to the source encoder 18. An output of the source encoder 18 is input to the turbo encoder 22 of the transmitter 20. An output of the turbo encoder 22 is input to the channel interleaver 24. An output of the channel interleaver 24 is input to the modulator 26.

The receiving device 14 includes a receiver 28 connected to a source decoder 36, which is connected to an information sink 38. The receiver 28 includes a demodulator 30, a channel deinterleaver 32, and a special space-efficient turbo decoder 34, which is constructed in accordance with the teachings disclosed herein. An input of the demodulator 30 is connected to an output of the modulator 26 of the transmitting device 12 via a wireless channel 40. An output of the demodulator 30 is connected to an input of the channel deinterleaver 32. An output of the channel deinterleaver 32 is connected to an input of the turbo decoder 34. An output of the turbo decoder 34 is input to the source decoder 36, an output of which is input to the information sink 38. The turbo decoder 34 provides optional scaling feedback to the channel deinterleaver 32 as discussed more fully below.

In operation, the information source 16 provides voice signals or other data to the source encoder 18. The information source 16 may be a human, an input device, such as a keypad or microphone, or another data source, such as a network. The source encoder 18 digitally encodes information provided by the information source 16 into a predetermined electronic format that is suitable for use with the turbo encoder 22. Source encoders are generally known in the art. The details of the source encoder 18 are application-specific and may be chosen by one skilled in the art to meet the needs of a given application.

The output of the source encoder 18 represents a stream of digital binary bits $d_k$, which represent either 1 or 0. In the present embodiment, the turbo encoder 22 encodes the bits $d_k$ into a turbo code representing a parallel concatenation of Recursive Systematic Convolutional (RSC) codes. The resulting turbo-encoded bits are input to the channel interleaver 24. The channel interleaver 24 reorders input bits via a pseudo random permutation function $\alpha$ so that bits at an $i^{th}$ location are moved to a location $\alpha(i)$ in accordance with the pseudo random rule $\alpha$. The interleaver 24 may be implemented as a block interleaver, which reads data into a memory block row by row and reads out the data column by column.

The re-ordered bits are input to the modulator 26, which prepares the digital turbo-encoded interleaved signal for transmission over the wireless channel 40. The modulator 26 includes baseband-to-IF mixers (not shown) which up-convert digital baseband signals output by the channel interleaver 24 to IF signals and IF-to-RF mixers (not shown) that convert the IF signals to RF signals in preparation for radio transmission across the channel 40. The modulator 26 also performs functions such Pseudo Noise (PN) spreading, wherein in-phase and quadrature signal components are mixed with corresponding PN functions in preparation for wireless transmission. The modulator 26 also adds a pilot signal to the output signal 42, which is transmitted across the channel 40 via a transmitter antenna (not shown).

The demodulator 30 of the receiving device 14 receives wireless signals 42 output from the modulator 26 of the receiving device 12 and transmitted across the wireless channel 40. In the present specific embodiment, the wireless signals 42 are Code Division Multiple Access (CDMA) signals, and the system 10 is a CDMA system. The demodulator 30 includes a channel estimator and a rake receiver followed by RF-to-IF and IF-to-baseband circuitry (not shown). As is well known in the art, a rake receiver is a multistage receiver having several banks of correlation receivers. Each stage estimates the received signal from each user of the system 10. The resulting estimates are added and then subtracted from the overall received signal. The estimate of the desired signal received from the user of the transmitting device 12 is then added back in, yielding a residual signal from which and a bit estimate is made.

The demodulator 30 demodulates the received signals 42 and provides corresponding digital demodulated signals to the channel deinterleaver 32. The channel deinterleaver 32 deinterleaves the demodulated signals via the permutation function $\alpha^{-1}$, which is the inverse of the permutation function $\alpha$ of the channel interleaver 24. In the present embodiment, the channel deinterleaver 32 outputs a bit sequence representing a parallel concatenation of constituent RSC codes with additional noise and interference terms added by the wireless channel 40. The turbo decoder 34 decodes the deinterleaved bit stream using the well-known Logarithmic A Posteriori (Log-MAP) algorithm.

Unlike conventional turbo decoders that require two or more separate extrinsic memories and/or two or more separate Log-MAP decoders, the turbo decoder 34 is space-efficient, in that it requires only one extrinsic memory and only one Log-MAP decoder. Consequently, the turbo decoder 34 may be made smaller and less expensive than its conventional counterpart. This helps reduce the size and cost of the associated receiving device 14 of the digital communications system 10.

The decoded signal $\hat{d}_k$ output from the turbo decoder 34 is an estimate of the digital signal $d_k$ input to the turbo encoder 22 of the transmitting device 12. The decoded signal $\hat{d}_k$ is then further decoded and formatted by the source decoder 36 in preparation for output by the information sink 38.

Figure 2:
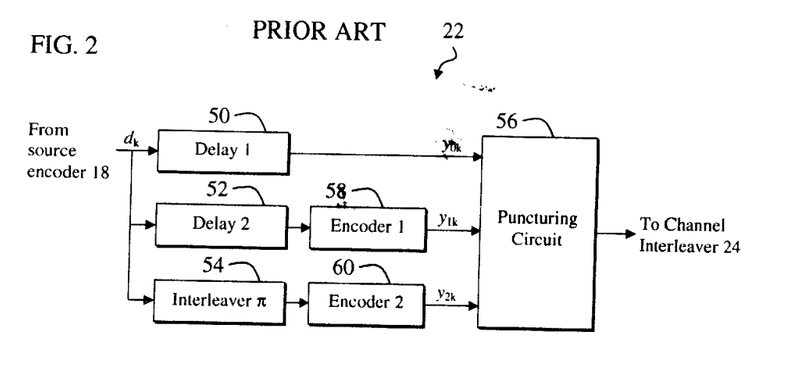
FIG. 2 is a more detailed diagram of a conventional turbo encoder adapted for use with the communications system of FIG. 1.

FIG. 2 is a more detailed diagram of a conventional turbo encoder 22 adapted for use with the communications system 10 of FIG. 1. The following review of the conventional turbo encoder 22 is intended to facilitate an understanding presently disclosed method and apparatus.

The turbo encoder 22 includes a first delay 50, a second delay 52, and an interleaver ($\pi$) 54, each of which receive the digital bit stream $d_k$ as input. An output $y_{0k}$ of the first delay 50 is input to a puncturing circuit 56. An output of the second delay 52 is input to a first encoder 58, whose output $Y_{1k}$ is input to the puncturing circuit 56. An output of the interleaver 54 is input to a second encoder 60, whose output $y_{1k}$ is input to the puncturing circuit 56. The puncturing circuit 56 provides output to the channel interleaver 24 of FIG. 1. In the present embodiment, the first encoder 58 and the second encoder 60 are RSC encoders.

In operation, the first delay 50 delays the digital input sequence $d_k$ and outputs a corresponding shifted digital sequence $Y_{0k}$ to the puncturing circuit 56. The second delay 52 delays the digital input sequence $d_k$ and provides the corresponding shifted output to the first encoder 58. The first encoder 58 encodes the delayed digital sequence using convolutional coding techniques. The encoder 58 then outputs the corresponding encoded signal $Y_{1k}$ to the puncturing circuit 56. Similarly, the second encoder 60 encodes the digital interleaved sequence output by the interleaver 54 with a predetermined permutation function $\pi$. The encoder 60 then outputs the corresponding encoded signal $Y_{2k}$ to the puncturing circuit 56.

The puncturing circuit 56 sequences the parallel signals $Y_{0k}$, $Y_{1k}$, and $Y_{2k}$ into a single sequence, i.e., turbo code that is provided to the channel interleaver 24 of FIG. 1. The puncturing circuit 56 may also adjust the code rate of the output signal to meet the needs of a given application. The turbo encoder 22 shown in FIG. 2 is a ⅓ rate turbo encoder, wherein data sequences of k input bits are mapped to code words of 3k symbols. The output of the puncturing circuit 56 is a ⅓ rate code, however the code rate may be increased (such as to ½) by puncturing.

The well known Viterbi algorithm is often used to decode a conventional convolutional code, such as a code output from the first RSC encoder 58. The Viterbi algorithm computes a Maximum Likelihood (ML) solution, which represents the most probable sequence of transmitted data bits m given a received sequence y. ML is worse than MAP if we knows the a priori information (no a priori information, then ML is essentially equal to the MAP algorithm), the turbo decoding is to estimate a priori information, and use it for MAP decoding.

Figure 3:
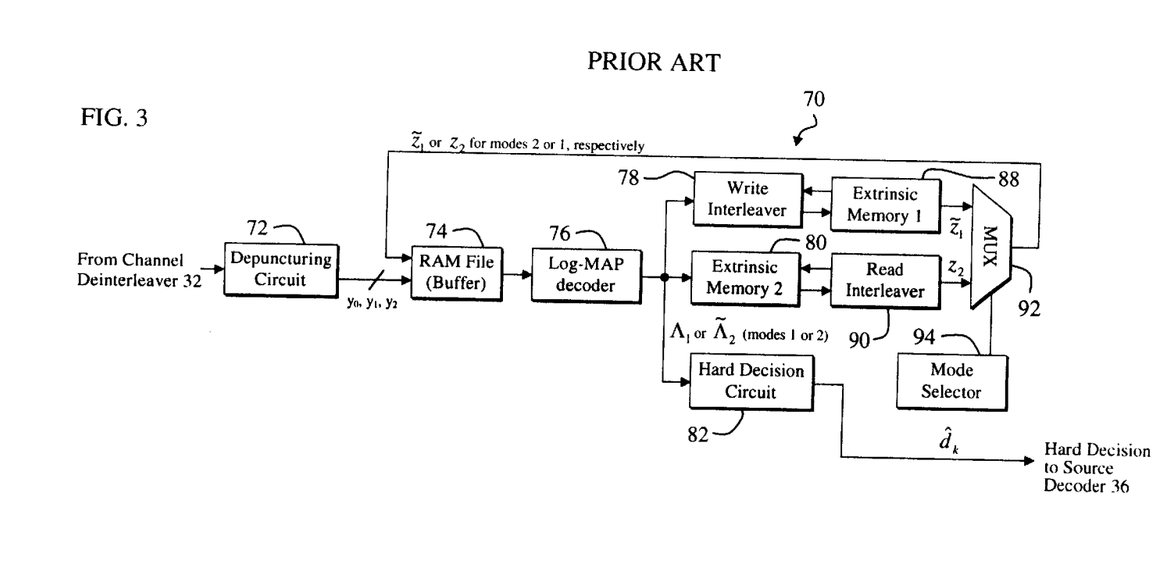
FIG. 3 is a block diagram of a conventional turbo decoder.

To decode the turbo-encoded signal 42 output from the modulator 26 of FIG. 1, the following system of equations (1) through (4) are iteratively solved via the turbo decoder 70:

$$\Lambda_{1k} = \log\left(\frac{P[\hat{d}_k = 1 | y_0, y_1, z_2]}{P[\hat{d}_k = 0 | y_0, y_1, z_2]}\right), \quad [1]$$

$$\tilde{\Lambda}_{2k} = \log\left(\frac{P[\tilde{\hat{d}}_k = 1 | \tilde{y}_0, y_2, \tilde{z}_1]}{P[\tilde{\hat{d}}_k = 0 | \tilde{y}_0, y_2, \tilde{z}_1]}\right), \quad [2]$$

where a tilde over a variable represents its interleaved value: and $\Lambda_{1k}$ is the first Log-Likelihood Ratio (LLR) associated with the estimate $\hat{d}_k$ of the received data;

$\Lambda_{2k}$ is the Log-Likelihood Ratio (LLR) associated with the interleaved version $\tilde{\hat{d}}_k$ of the estimate $\hat{d}_k$;

$y_0$ is a sequence of observed systematic bits $Y_{0k}$ Output from the delay 50 of FIG. 2;

$\tilde{y}_0$ represents the interleaved version of $y_0$;

$y_1$ is a sequence of parity bits $Y_{1k}$ output from the first constituent encoder 58 of FIG. 2;

$y_2$ is a sequence of parity bits $Y_{2k}$ output from the second constituent encoder 60;

$\tilde{z}_1$ represents an interleaved version of a sequence of bits $z_{1k}$ representing so called extrinsic information output from the log-MAP decoder 76 when in a first mode, as discussed more fully below; and $z_2$ represents a vector of extrinsic information $z_{2k}$ output from the log-MAP decoder 76 when in a second mode, as discussed more fully below.

$\Lambda_{1k}$ is defined in equation (1) as the logarithm of the ratio of two conditional probabilities. The numerator represents the probability that the received data bit estimate $\hat{d}_k$ represents 1 given that $y_0$, $y_1$, and $z_2$ were received. The denominator represents the probability that the received data bit estimate $\hat{d}_k$ represents 0 given that $y_0$, $y_1$, and $z_2$ were received.

Similarly, $\tilde{\Lambda}_{2k}$ is defined in equation (2) as the logarithm of the ratio of two conditional probabilities. The numerator represents the probability that the interleaved version of the received data $\tilde{\hat{d}}_k$ represents 1 given that $\tilde{y}_0, y_2$, and $\tilde{z}_1$ were received. The denominator represents the probability that the interleaved version of the received data $\tilde{\hat{d}}_k$ represents 0, given that $\tilde{y}_0, y_2$, and $\tilde{z}_1$ were received.

Extrinsic information bits $z_{1k}$ and $z_{2k}$ are related to the LLR's $\Lambda_{1k}$ and $\tilde{\Lambda}_{2k}$ of equations (1) and (2) by the following equations respectively:

$$z_{1k} = \Lambda_{1k} - y_{0k} - z_{2k}, \quad [3]$$

$$\tilde{z}_{2k} = \tilde{\Lambda}_{2k} - \tilde{y}_{0k}\tilde{z}_{1k}, \quad [4]$$

where the variables are defined as provided above.

The estimate $\hat{d}_k$ of the received data is obtained by hard limiting the output of the log-MAP decoder 76 via the hard decision circuit 82 in accordance with the following equation:

$$\hat{d}_k = \begin{cases} 1 & \text{if } \Lambda_{2k} > 0 \\ 0 & \text{if } \Lambda_{2k} < 0 \end{cases}. \quad [5]$$

The LLR's of equations (1) and (2) are computed iteratively via the turbo decoder 70 using the well known Log-MAP algorithm, which is described more fully in a preliminary report published by Virginia Tech on September 1998 and written by M. C. Valenti entitled "Iterative Detection and Decoding for Wireless Communications". The iterative process is performed on a "window" of information provided by the depuncturing circuit 72. The window of information is circulated through the decoder 70 several times before the next window of data is read from the depuncturing circuit 72. In one embodiment of the disclosed method and apparatus, the window is equal to 32 words, each word being a 6-bit value that represents a soft decision for one bit of the encoded data.

In operation, initially, the depuncturing circuit 72 depunctures the signal received from the channel deinterleaver, such as the deinterleaver 32 of FIG. 1, using application-specific methods that are well known in the art. The depunctured signal represents the three vectors $y_0$, $y_1$, and $y_2$, as defined above. This depunctured signal is input to a RAM File 74, which buffers the signal.

The decoder 70 may be thought of as comprising two functional loops. A first functional loop includes an extrinsic memory 80, a read interleaver 90, the MUX 92, the RAM file 74, a log-MAP decoder 76, a write interleaver 78, and an extrinsic memory 88. A second functional loop includes the extrinsic memory 88, the MUX 92, the RAM file 74, the log-MAP decoder 76, and the extrinsic memory 80.

When the decoder 70 is in a first operational mode, the decoder employs the first functional loop section. In contrast, when the decoder 70 is in the second operational mode, the second functional loop section is employed. The first time the first operational mode occurs, the contents of the RAM file 74 are clocked into a Log-MAP decoder 76. The log-MAP decoder 76 estimates the LLR's $\Lambda_{1k}$ of equation (1) during the first pass of a first operational mode using the data provided by the puncturing circuit 72 and a predetermined initial value for z (since there is no previous value from the log-MAP decoder 76 to use to generate a current value for z). In one embodiment, the initial value for z is zero.

The output log-MAP decoder 76 is input to the write interleaver 78. The write interleaver 78 is used in combination with the first extrinsic memory 88 to implement an interleaving function on the output from the log-MAP decoder 76. Concurrently, the output from the log-MAP decoder 76 is stored in the second extrinsic memory 80.

The turbo decoder then transitions to a second operational mode. In the second operational mode, the MUX 92 selects the output from the first extrinsic memory 88. The write interleaver 78 and the first extrinsic memory 88 comprise an interleaving function. The MUX 92 couples the output of the first extrinsic memory 88 to the RAM file 74, which stores that data. The output from the RAM file 74 is coupled to the log-MAP decoder 76. Therefore, it can be seen that in the second mode of operation, the log-MAP decoder 76 is provided with the data stored in the first extrinsic memory 88. The output of the first extrinsic memory 88 represents interleaved extrinsic information $\tilde{z}_1 = \{\tilde{z}_{1k}\}$. The log-MAP decoder 76 calculates the value $\Lambda_{2k}$ in accordance with formula [2] provided above. The output $\tilde{\Lambda}_{2k}$ from the log-MAP decoder 76 is coupled to, and stored in, the second extrinsic memory 80.

After completing the second operational mode, the turbo decoder 70 switches back to the first operational mode. In the first operational mode, a mode selector circuit 94 selects the output of a read interleaver 90 as the output of the MUX 92. The second extrinsic memory 80 and the read interleaver 90 implement a deinterleaving function. The output of the read interleaver 90 represents extrinsic information $z_2 = \{z_{2k}\}$. Accordingly, extrinsic information $z_2$ is read from the read interleaver 90 and output by the MUX 92 to the RAM file 74. It should be noted, however, during the first pass of the first operational mode (which was described above), the value of z is set to the predetermined initial value, as noted above. Therefore, the output $\Lambda_{1k}$ from the log-MAP decoder 76, and the resulting value z output from the read interleaver 90 are not used in the first iteration of the decoding process. However, in the second pass of the first operational mode, the RAM file 74 outputs the stored values of $y_0$, $y_1$, and $z_2$ to the log-MAP decoder 76.

In either case, during the first operational mode, the output from the RAM file 74 is coupled to the log-MAP decoder 76. The log-MAP decoder 76 computes the value of $\Lambda_{1k}$. The value of $\Lambda_{1k}$ is then coupled to the write interleaver 78. The output from the write interleaver 78 is then coupled to the first extrinsic memory 88. The write interleaver 78 and the memory 88 generate the value $\tilde{z}_1$. The first extrinsic memory 88 stores the value $\tilde{z}_1$ until the turbo decoder 70 switches to the second operational mode.

Hence, in the first operational mode, the extrinsic information $z_2$ is read from the second extrinsic memory 80 and coupled by the MUX 92 and the RAM file 74 to the log-MAP decoder 76 and the output of the log MAP decoder 76 is coupled to the write interleaver and written to the first extrinsic memory 88. In the second operational mode, the deinterleaved extrinsic information $\tilde{z}_1$ output from the first extrinsic memory 88 is output from the MUX 92 and coupled to the log-MAP decoder 76 by the MUX 92 and the RAM file 74. The output from the MUX 92 is coupled to the second extrinsic memory 80 and stored therein.

The mode of the turbo decoder 70 continues to alternate between the first operational mode and the second operational mode for each iteration. Every predetermined number of iterations, the output of the log-MAP decoder 76 is tapped by the hard decision circuit 82. In accordance with one embodiment of the disclosed method and apparatus, the turbo decoder 70 performs 10 iterations. Accordingly, after the predetermined number of iterations, the hard decision circuit 82 outputs hard decisions $\hat{d}_k$. The output is an estimate of the original data $d_k$ input to the corresponding turbo encoder, such as the turbo encoder 22 of the transmitter 12 of FIG. 1 and used to generate the values received from the depuncturing circuit 72. The turbo decoder output $\hat{d}_k$ of the hard decision circuit 82 is forwarded to a source decoder, such as the source decoder 36 of FIG. 1.

Older turbo decoders required two or more Log-MAP decoders, one corresponding to the log-MAP decoder 76 in the first operational mode, and the other corresponding the log-MAP decoder 76 in the second operational mode.

Figure 4:
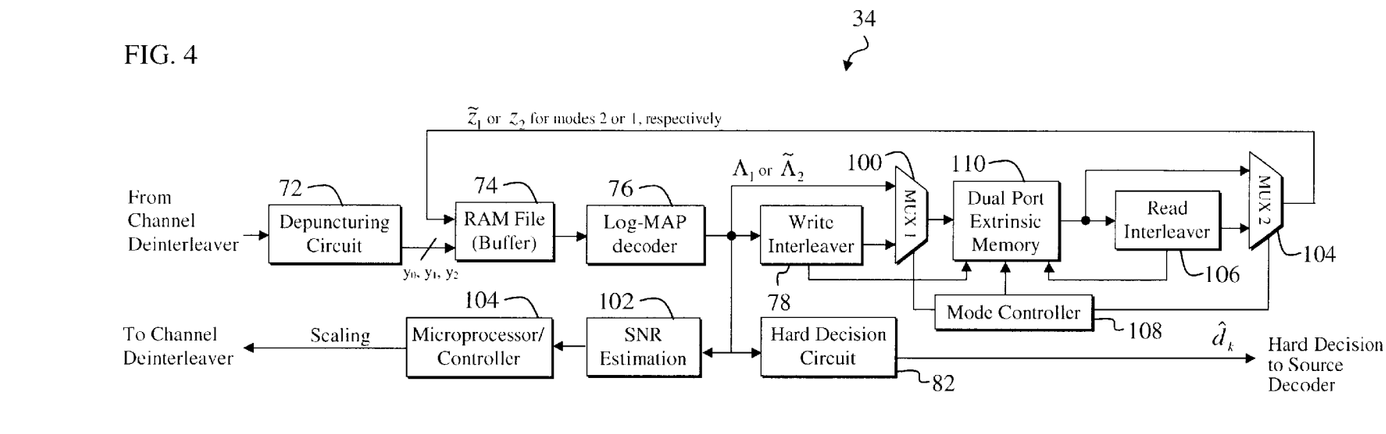
FIG. 4 is a more detailed block diagram of the space-efficient turbo decoder of FIG. 1 having only one extrinsic memory.

FIG. 4 is a block diagram of the space-efficient turbo decoder 34 of FIG. 1. For clarity, various components, such as power supplies, clocking circuits, amplifiers, and so on, are omitted from FIG. 4. However, one skilled in the art with access to the present teachings will know where and how to implement any requisite components not shown. The turbo decoder design of the space-efficient decoder 34 eliminates the need for two separate extrinsic memories, such as the two memories 80 and 88 of FIG. 3.

The space-efficient turbo decoder 34 includes the depuncturing circuit 72, the RAM 74, and the log-MAP decoder 76. The output of the log-MAP decoder 76 is connected to the write interleaver 78, a first input of a first MUX 100, and the hard decision circuit 82, and a Signal-to-Noise Ratio (SNR) estimation circuit 102. An output of the SNR estimation circuit 102 is input to a microprocessor/controller 104, which provides scaling feedback to the channel deinterleaver 32 of FIG. 1, which provides input to the depuncturing circuit 72. An output of the write interleaver 78 is connected to a second input of the first MUX 100, an output of which is input to a dual port extrinsic memory 110. An output of the dual port extrinsic memory 110 is connected to a first input of a second MUX 104 and to an input of a read interleaver 106. An output of the read interleaver 106 is connected to a second input of the second MUX 104. An output of the second MUX 104 is input to the RAM 74. A mode controller circuit 108 is connected to control terminals of the first MUX 100, the second MUX 104, and the dual port extrinsic memory 110. The mode controller circuit 108 controls MUX switching to selectively and periodically switch the mode of the turbo decoder 34 between first and second operational modes as discussed more fully below.

The operation of the turbo decoder 34 is functionally similar to the turbo decoder 70 of FIG. 3. However, the section of FIG. 3 that includes the write interleaver 78, the first extrinsic memory 88, the second extrinsic memory 80, the read interleaver 90, the 2:1 MUX 92, and the mode selector 94 is replaced with a circuit in FIG. 4 that includes the write interleaver 78, the first MUX 100, the dual port extrinsic memory 110, the read interleaver 106, the second MUX 104, and the mode controller 109. Accordingly, a first functional loop in the disclosed decoder 34 of FIG. 4 includes the dual port extrinsic memory 110, the read interleaver 106, the second MUX 104, the RAM file 74, the log-MAP decoder 76, the write interleaver 78, and the first MUX 100. The second functional loop in the disclosed decoder 34 of FIG. 4 includes the dual port memory, the second MUX 104, the RAM file 74, the log-MAP decoder 76, and the first MUX 100.

The first functional loop is employed in a first operational mode. In the first operation mode, the dual port extrinsic memory 110 is read by the read interleaver 106, whose output is selected as the output of the second MUX 104 under the control of the mode controller 108. Hence, similar to the turbo decoder 70 of FIG. 3, in the first operational mode of the decoder 34, the output of the read interleaver 106 is fed back to the RAM 74. The output from the RAM file 74 is coupled to the log-MAP decoder 76. The output from the log-MAP decoder 76 is coupled to the first MUX 100. The mode controller 108 causes the MUX 100 to select the output from the write interleaver 78. Accordingly, the output from the write interleaver 78 is coupled to, and stored in, the dual port extrinsic memory 110. Similar to the operation of the decoder 70 in FIG. 3, in the first operational mode, the output of the log-MAP decoder 76 is an estimate of the LLR $\Lambda_{1k}$ (see equation 1).

However, the turbo decoder 70 of FIG. 3 requires two extrinsic memories, while the decoder 34 of FIG. 4 requires only one extrinsic memory 110 that can be written to and read from. In practice, the single extrinsic memory 110 is much smaller than the two extrinsic memories 80 and 88. Experimental results have shown that the dual port extrinsic memory 110 is approximately 2.542 square millimeters compared to 4.356 square millimeters for the two extrinsic memories 80 and 88. This represents a 41.6 percent memory space reduction or a 1.814 square millimeter space savings. This savings is significant.

In the second operational mode, the mode controller 108 causes the second MUX 104 to select the output of the dual port extrinsic memory 110. Consequently, the interleaved extrinsic output $\tilde{z}_1$ of the dual port extrinsic memory 110 is fed back to the RAM file 74. The output from the RAM file 74 is coupled to the input of the log-MAP decoder 76. Accordingly, the log-MAP decoder 76 estimates $\Lambda_{2k}$ (see equation (2)), which represents an interleaved LLR. The mode controller 108 causes the second MUX 104 to select the output of the log-MAP decoder 76. Consequently, the output of the log-MAP decoder 76 is written to the dual port extrinsic memory 110. Hence, the operation of the decoder 34 of FIG. 4 in the second operational mode is similar to the operation of the turbo decoder 70 of FIG. 3 in the second operational mode.

In the first operational mode, the write interleaver 78 and the dual port extrinsic memory 110 act as an interleaver, i.e., a first functional section, while the dual port extrinsic memory 110 and the read interleaver 106 act as a deinterleaver, i.e., a second functional section. For the purposes of the present discussion, the term functional section refers to sections differing by function. Note that, in accordance with the above definition, a single circuit that implements two different functions, may be considered as having a first functional section and a second functional section corresponding to the first function and the second function, respectively.

Hence, in the first operational mode, the input of the log-MAP decoder 76 is deinterleaved by blocks 110 and 106. The output of the log-MAP decoder 76 is interleaved by blocks 78 and 110 and stored in the dual port memory for use in the second operational mode. Accordingly, the input which is coupled to the log-MAP decoder 76 in the second operational mode, was previously interleaved by blocks 78 and 102 in the first operational mode.

The SNR estimation circuit 102 employs the output of the log-MAP decoder 76 to calculate a Signal-to-Noise Ratio (SNR) in accordance with methods known in the art. The resulting SNR is provided to the microprocessor/controller 104, which calculates channel interleaver scaling values. The details of the scaling value calculations are application-specific and may be determined by one skilled in the art to meet the needs of a given application. The scaling values are fed back to the channel interleaver 32 of FIG. 1, which appropriately adjusts channel interleaving functions in response thereto. Those skilled in the art will appreciate that the channel interleaving feedback path comprising the SNR estimation circuit 102 and the microprocessor/controller 104 may be omitted.

Although the present discussion pertains to ⅓ rate turbo decoders, those skilled in the art will appreciate that the disclosed method and apparatus may be adapted for use with different rate turbo decoders. Those skilled in the art with access to the present teachings will appreciate that the turbo decoder of FIG. 4 may easily be scaled or adjusted to accommodate a different decoder rate or the needs of a given application.

In the present specific embodiment, the read interleaver 90 and the write interleaver 78 are constructed in accordance with the CDMA 2000 Telecommunications Industry Association (TIA) standard. The interleavers 78 and 90 perform memory address calculations for data entering and exiting the extrinsic memory 110 these calculations are provided as control input to the dual port extrinsic memory 110.

After every certain number of iterations, such as ten iterations, the hard decision circuit 82 hard limits the output of the log-MAP decoder 76 in accordance with equation (5) or a similar equation. The output of the hard decision circuit 82 is an estimate $\hat{d}_k$ of the data $d_k$ output from the source encoder 18 of FIG. 1. The estimate $\hat{d}_k$ is input to the source decoder 36 of FIG. 1.

In one embodiment, the number of turbo decoder iterations is fixed and is between 10 and 20 iterations before hard decision circuit 82 samples the output of the log-MAP decoder 76. However, the number iterations is application-specific and may be determined dynamically with reference to a quality metric, such as a Cyclic Redundancy Check (CRC) metric. Accordingly, other embodiments may perform more or less iterations, and the number of iterations may be adjusted within the decoder to suit the particular implementation.

Figure 5:
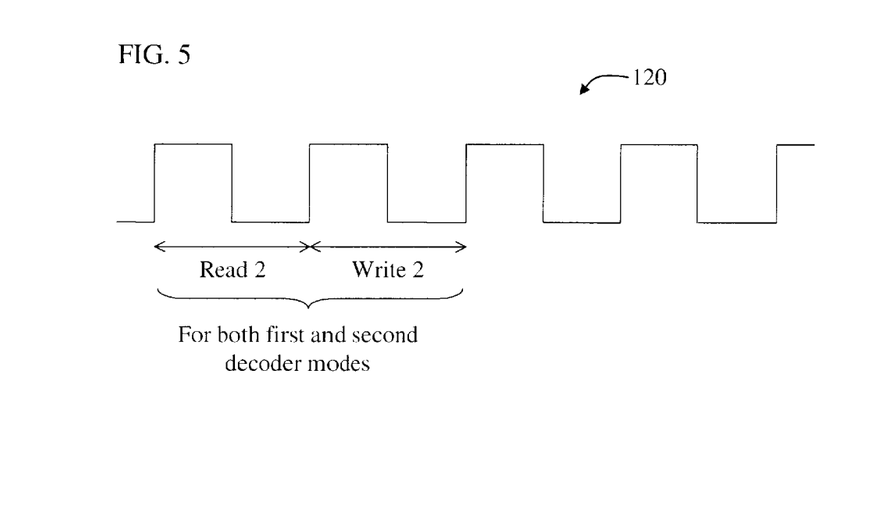
FIG. 5 is a timing diagram illustrating the read and write timing of the turbo decoder of FIG. 4.

FIG. 5 is a timing diagram illustrating the read and write timing of the turbo decoder 34 of FIG. 4. In a given clock cycle of a clock signal sequence 120, the contents of two memory addresses of the dual port extrinsic memory 110 of FIG. 4 are read, while in the subsequent clock cycle, the contents of two memory addresses are written.

Figure 6:
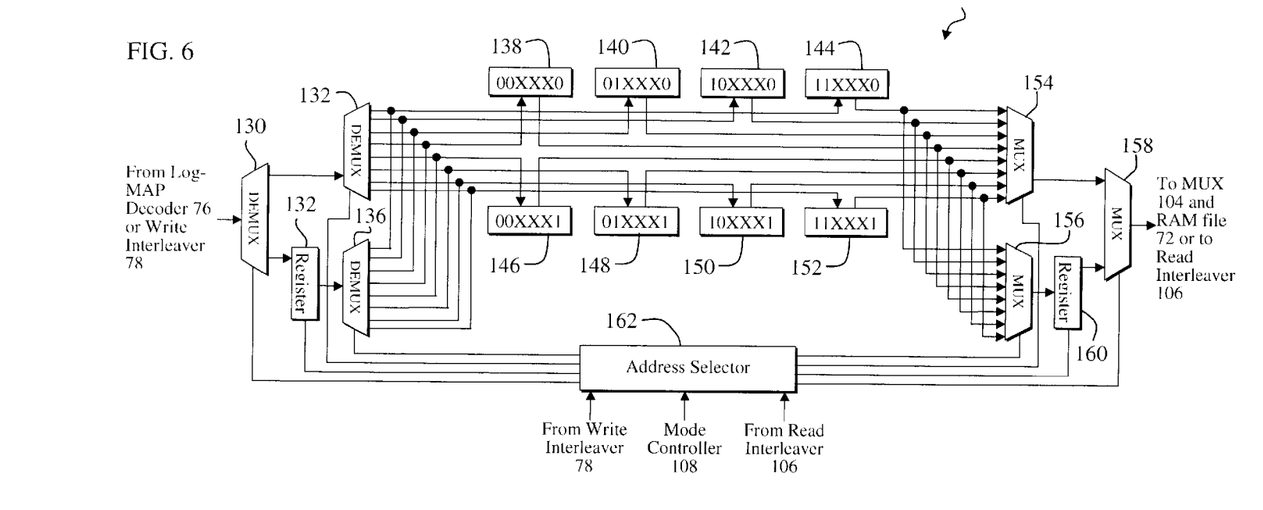
FIG. 6 is a more detailed diagram of the space-efficient extrinsic memory of FIG. 4.

FIG. 6 is a more detailed diagram of the space-efficient dual port extrinsic memory 110 of FIG. 4. The dual port extrinsic memory 110 includes a first 1:2 Demultiplexer (DEMUX) 130 that receives input from the write interleaver 78 or the log-MAP decoder 76 of FIG. 4 when the extrinsic memory 110 is in the first operational mode or the second operational mode, respectively. A first output of the first 1:2 DEMUX 130 is connected to an input of a first 1:8 DEMUX 132. A second output of the first 1:2 DEMUX 130 is connected to an input of an input register 134. An output of the input register 134 is connected to an input of a second 1:8 DEMUX 136. Eight parallel outputs of the first 1:8 DEMUX are connected to 8 parallel outputs of the second 1:8 DEMUX 136, which are each connected to inputs of different memory elements that include a first memory element 138, a second memory element 140, a third memory element 142, a fourth memory element 144, a fifth memory element 146, a sixth memory element 148, a seventh memory element 150, and an eighth memory element 152. Each of the eight memory elements 138 through 152 are connected to one of eight parallel input lines of a first 8:1 MUX 154, where each of the parallel input lines of the first 8:1 MUX 154 are connected to corresponding parallel input lines of a second 8:1 MUX 156. An output of the first 8:1 MUX 154 is connected to a first input of a 2:1 MUX 158. An output of the second 8:1 MUX is connected to an input of an output register 160. An output of the register 160 is connected to a second input of the 2:1 MUX 158. An output of the 2:1 MUX 158 is provided to the RAM 74 of FIG. 4 and to the read interleaver 106 of FIG. 4. An address selector 162 is connected to control inputs of the DEMUX's 130, 132, and 136, and the MUX's 154, 156, and 158. The registers 134 and 160 receive control inputs that are enabled every other clock cycle via the address selector 162 and/or the mode controller 108 of FIG. 4. The address selector 162 receives input from the write interleaver 78, the read interleaver 106, and the mode controller 108 of FIG. 4. The write interleaver 78, the read interleaver 106, and the mode controller 108 provide control inputs to the dual port extrinsic memory 103.

In operation, with reference to FIGS. 4 and 6, a bit stream output from the log-MAP decoder 76 representing an LLR or an interleaved LLR output from the write interleaver 78 is input to the 1:2 DEMUX 130. In the first operational mode, the output of the log-MAP decoder 76 is input to the 1:2 DEMUX 130. LLR bits corresponding to a symbol are written to a selected one of the eight memory elements 138 through 152.

If the extrinsic memory 110 is in an interleaver sub-mode, the extrinsic memory 110 is written linearly and read interleaved, which represents interleaving. Similarly, when the extrinsic memory 110 is in a deinterleaver sub-mode, the extrinsic memory 110 is written interleaved and read linearly, which corresponds to deinterleaving.

In the interleaver sub-mode of the first operational mode, the memory element to which the LLR bits are written is based on a linear address representing the bit-position of the given data frame. The extrinsic memory 110 is then read interleaved, i.e., the output of the MUX 158 represents the contents of the memory element having an address representing the interleaved version of the linear address.

Before the extrinsic memory 110 is read, two memory elements are written. One memory element receives the LLR bits associated with a given symbol and has a linear address with 0 as the least significant bit. Another memory element has a linear address with 1 as the least significant bit. After two memory elements are written, then two memory elements are read.

If the extrinsic memory 110 is in a deinterleaver sub-mode, the address selector 162 controls the input DEMUX's 130, 132, and 136 so that LLR's associated with a given symbol are written interleaved, i.e., written to a memory element associated with the interleaved address of the given symbol. The address of a given symbol corresponds to deinterleved bit-position of the given data frame. Similarly, the switching of the output MUX's 154, 156, and 158 is controlled by the address selector 162 so that the extrinsic memory 110 is linearly read, i.e., the contents of a memory element having a linear address as determined by the bit-position of the given data frame.

The reading functionality of the extrinsic memory 110 is the inverse of the writing functionality of the extrinsic memory 110. For example, writing interleaved to the extrinsic memory 110 is similar to reading interleaved from the extrinsic memory, but the operations are performed in inverse order.

The address selector 162 receives input from the write interleaver 78, the mode controller 108, and the read interleaver 106 of FIG. 4. The address selector 162 employs these inputs to generate MUX and DEMUX controls signals to implement linear writing, interleaved writing, linear reading, and/or interleaved reading in accordance with the operational mode. For example, in the first operational mode, the extrinsic memory 110 acts as an interleaver and is linearly written and read interleaved. In the second operational mode, the extrinsic memory acts as a deinterleaver and is written interleaved (based on the interleaved address input from the write interleaver to the address selector 162) and read linearly. The manner in which the extrinsic memory 110 is written to and read from is controlled by the address selector 162 based on the operational mode as determined by control input received from the mode controller 108 of FIG. 4.

It will be clear to those skilled in the art that the mode selector circuit 94 may be implemented by one skilled in the art with access to the present teachings using simple timing and clocking circuitry. Furthermore, read and write interleavers, such as the interleavers 78 and 90 are known in the art.

Figure 7:
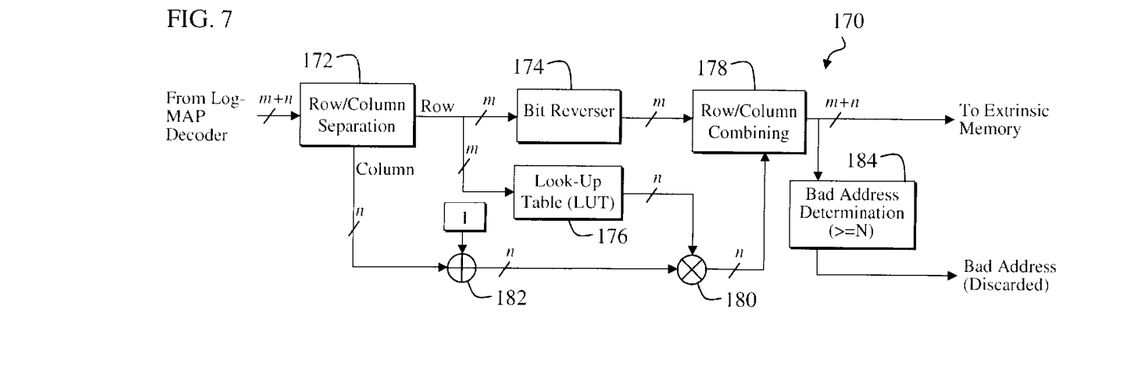
FIG. 7 is a diagram of a conventional CDMA 2000 turbo code interleaver employed to read and write the dual port extrinsic memory of FIG. 6.

FIG. 7 is a diagram of a CDMA 2000 turbo code interleaver 170 employed to read and write the dual port extrinsic memory 110 of FIG. 6. The turbo code interleaver 170 may be modified by one skilled in the art for use as the write interleaver 78 or the read interleaver 106 of FIG. 4.

With reference to FIGS. 4 and 7, in the present embodiment, the turbo code interleaver 170 includes a row/column separator 172 that receives an input address from the Log-MAP decoder 76. The input address represents the bit-position of the given data frame.

The input address is m+n bits wide. The upper n bits of a given address symbol represent a column, while the lower m bits represent a row. The row/column separator 172 outputs m row bits, i.e., the lower m bits, to a bit reverser 174 and a Look-Up Table (LUT) 176. The bit reverser 174 reverses the m bits and provides the output to a row/column combiner 178. The LUT 176 outputs n bits, one bit for each column, to a multiplier 180.

The n column bits output from the row/column separator 172 are input to an adder 182, which adds 1 to the received n column bits and provides n output column bits in response thereto to an input of the multiplier 180. The multiplier 180 multiplies the output of the adder 182 with the output of the LUT 176 and outputs n column bits to the row/column combiner 178 in response thereto. The row/column combiner 178 outputs m+n bits to the extrinsic memory 110, where the upper m bits represent the bit reversed m bits output from the bit reverser 174, and the lower n bits represent the output of the multiplier 180. Bad addresses output from the row/column combiner 178 are selected by a bad address determination circuit 184 and then discarded.

The extrinsic memory 102 of FIG. 6 employs the property of this particular interleaved address generation, namely, every two consecutive interleaved addresses will have one of the following addresses: 00XXXX, 01XXXX, 10XXXX, and 11XXXX. These two addresses will not have the same two most significant bits. For other interleaving schemes (e.g., for W-CDMA), one skilled in the art can easily determine the appropriate interleaving property such that two consecutive interleaved addresses are different in a certain way, such as by a look-up-table mapping.

Those having ordinary skill in the art and access to the present teachings will recognize additional modifications, applications, and embodiments within the scope of the disclosed method and apparatus. Accordingly, it will be understood that the invention is defined solely by the claims appended hereto and should not be limited to the particular methods and apparatus disclosed herein.

Accordingly, What is claimed is:

1. A turbo decoding circuit having a first and second operational mode of operation, comprising:
    (a) a first functional loop for use in the first operational mode, the first loop including:
        (1) a write interleaver having an input and an output;
        (2) a dual port extrinsic memory having an input and an output, the input being coupled to the write interleaver output;
        (3) a read interleaver having an input and an output, the input being coupled to the output of the dual port extrinsic memory;
        (4) a buffer circuit having an input and an output, the input of the buffer being coupled to the output of the read interleaver; and
        (5) a log-MAP decoder having an input and an output, the input being coupled to the output of the buffer and the output of the log-MAP decoder being coupled to the write interleaver; and
    (b) a second functional loop for use in the second operational mode, the fir second loop including:
        (1) the dual port extrinsic memory;
        (2) the buffer circuit, the input of the buffer circuit being coupled to the output of the dual port extrinsic memory; and
        (3) the log-MAP decoder, the input of the log-MAP decoder being coupled to the output of the buffer circuit, and the output of the log-MAP decoder being coupled to the input to the dual port extrinsic memory.

2. The turbo decoder circuit of claim 1, further comprising:
    (a) a multiplexer having an output and a first and second input, the first input being coupled to write interleaver, the second input being coupled to the output of the log-MAP decoder, and the output of the multiplexer being coupled to the input of the dual port extrinsic memory; and
    (b) a timing circuit coupled to the multiplexer;
    wherein the multiplexer and the timing circuit establish the first operational mode and the second operational mode by switching between the first functional loop and the second functional loop.

3. The turbo decoder circuit of claim 2, further comprising a second multiplexer, the second multiplexer having an output and a first and second input, the first input being coupled to output of the read interleaver, the second input of the second multiplexer being coupled to the output of the dual port extrinsic memory, and the output of the second multiplexer being coupled to the input of the buffer circuit.

4. The system of claim 3, wherein the first memory is the only extrinsic memory employed by the loop to implement the logarithmic maximum a posteriori algorithm.

5. A space-efficient turbo decoder comprising:
    (a) a loop including a decoder, a write interleaver, a read interleaver, and a first memory, configured to implement a logarithmic maximum a posteriori algorithm; and
    (b) a first multiplexer, coupled between the decoder and the first memory, and a second multiplexer, coupled to an output of the read interleaver, for selectively bypassing the write interleaver or the read interleaver in response to a control signal so that the decoder, the write interleaver, the read interleaver, and the first memory implement the logarithmic maximum a posteriori algorithm.

6. The space-efficient turbo decoder of claim 5, further including a controller for generating a control signal to control the first and second multiplexers.

7. A space-efficient turbo decoder comprising:
    (a) a channel deinterleaver in communication with a first memory;
    (b) a logarithmic maximum a posteriori decoder (log-MAP) connected at an output of the memory, an output of the log-MAP decoder connected to a hard decision circuit, an output of the hard decsion circuit providing an output of the space-efficient turbo decoder;
    c) a write interleaver connected at an output of the log-MAP decoder, an output of the write interleaver connected to a first input of a first multiplexer, a second input of the first mulitplexer connected at an output of the log-MAP decoder, an output of the first multiplexer connected to an input of a second memory;
    d) a read interleaver connected at an output of the second memory, an output of the read interleaver connected to a first input of a second multiplexer, a second input of the second mulitplexer connected to an output of the second memory, an output of the second multiplexer connected to an input of the first memory, wherein the log-MAP decoder, the write interleaver, the second memory, and the read interleaver are configured to implement a log-MAP algorithm; and
    e) a controller for selectively enabling inputs of the multiplexers so that the log-MAP decoder, the write interleaver, the second memory, and the read interleaver implement the Log-MAP algorithm.

* * * * *